United States Patent
Lee et al.

(10) Patent No.: US 7,081,401 B2
(45) Date of Patent: Jul. 25, 2006

(54) METHOD OF FABRICATING A P-TYPE OHMIC ELECTRODE IN GALLIUM NITRIDE BASED OPTICAL DEVICE

(75) Inventors: Jong Lam Lee, Pohang (KR); Ho Won Jang, Euiseong-gun (KR)

(73) Assignee: Pohang University of Science and Technology Foundation, Pohang (KR)

( * ) Notice: Subject to any disclaimer, the term of this patent is extended or adjusted under 35 U.S.C. 154(b) by 68 days.

(21) Appl. No.: 10/390,626

(22) Filed: Mar. 19, 2003

(65) Prior Publication Data
US 2003/0183828 A1   Oct. 2, 2003

(30) Foreign Application Priority Data
Mar. 20, 2002 (KR) ............... 10-2002-0015108

(51) Int. Cl.
*H01L 21/28* (2006.01)
(52) U.S. Cl. ........................ 438/604; 438/605
(58) Field of Classification Search ............... 438/650, 438/686, 685, 648, 656, 604, 605
See application file for complete search history.

(56) References Cited

U.S. PATENT DOCUMENTS

| | | | | |
|---|---|---|---|---|
| 6,100,174 A | * | 8/2000 | Takatani | 438/605 |
| 6,319,808 B1 | * | 11/2001 | Ho et al. | 438/597 |
| 6,326,294 B1 | * | 12/2001 | Jang et al. | 438/604 |

FOREIGN PATENT DOCUMENTS

| KR | P1997-0077764 A | 12/1997 |
|---|---|---|
| KR | P1999-0088218 A | 12/1999 |

\* cited by examiner

*Primary Examiner*—Tuan H. Nguyen
(74) *Attorney, Agent, or Firm*—Rothwell, Figg, Ernst & Manbeck

(57) ABSTRACT

A p-type ohmic electrode in a gallium nitride based(GaN based) optical device and a fabrication method thereof. The p-type ohmic electrode in a GaN based optical device is fabricated using a rutile structure transition metal layer, such as an Ru, Ir or Os layer, or an oxide layer thereof, or using a double layer comprised of an Ru layer as a base layer and an Ni layer, an ITO layer or an AuO layer on the Ru layer. Thus, the p-type ohmic electrode is good in light transmittance and is thermally stable while having low contact resistance with the p-GaN layer.

2 Claims, 6 Drawing Sheets

METHOD OF FABRICATING A P-TYPE OHMIC ELECTRODE IN GALLIUM NITRIDE BASED OPTICAL DEVICE

This application claims the priority of Korean Patent Application No. 02-15108, filed Mar. 20, 2002, in the Korean Intellectual Property Office, the disclosure of which is incorporated herein in its entirety by reference.

BACKGROUND OF THE INVENTION

1. Field of the Invention

The present invention relates to an ohmic electrode for use in an optical device and a fabrication method thereof, and more particularly, to a p-type ohmic electrode in a gallium nitride based(GaN based) optical device and a fabrication method thereof.

2. Description of the Related Art

Optical devices, e.g., light emitting devices utilizing gallium nitride based compound semiconductors such as GaN, InGaN or AlGaN, effectively emit light with blue light wavelength region and have high light power compared to conventional optical devices. In particular, blue light has a shorter wavelength than red light, it can be easily converted into longer wavelength light. Thus, in recent years, a great deal of attention has been directed to GaN light emitting devices as white-light emitting devices.

In fabricating a GaN light emitting device, an n-type ohmic electrode and a p-type ohmic electrode are formed on an n-type gallium nitride (n-GaN) layer and a p-type gallium nitride (p-GaN) layer, respectively. The n-type and p-type ohmic electrodes must have low contact resistance and must be thermally stable. In particular, the p-type ohmic electrode must be a transparent electrode that can transmit emitted light. However, the p-type ohmic electrode formed on the p-GaN layer has poor activation efficiency of Mg dopant doped into the p-GaN layer, so that a hole concentration of $10^{18}$ cm$^{-3}$ or higher cannot be obtained, making it difficult to attain contact resistance as low as approximately $10^{-5} \cdot$cm$^2$.

In a GaN light emitting device, a nickel (Ni)/gold (Au) layer formed by stacking an Ni layer on an Au layer is generally used as a p-type ohmic electrode because contact resistance of the ohmic electrode after annealing is low, e.g., approximately $10^{-4} \cdot$cm$^2$, the Ni layer is easily converted into a transparent nickel oxide (NiO) layer that easily transmits light, and the Au layer increases lateral transmittance of the electrode. The Ni/Au ohmic electrode having the entire thickness of approximately 10 nm has superior transparency to light in a wavelength region of 300.500 nm, that is, approximately 80%. However, when the Ni/Au ohmic electrode is annealed for forming an ohmic contact, internal diffusion of Au may occur, suggesting poor thermal stability, and the lateral profile of the Au layer is not uniform.

SUMMARY OF THE INVENTION

To solve the above-described problems, the present invention provides a p-type ohmic electrode in a gallium nitride (GaN) based optical device having increased luminescence efficiency with superior transmittance of light while having low contact resistance and superior thermal stability.

The present invention also provides a method of fabricating the p-type ohmic electrode in a gallium nitride (GaN) based optical device.

In an aspect of the present invention, there is provided a GaN based optical device including a substrate, a p-GaN layer formed on the substrate, and a p-type ohmic electrode formed on the p-GaN layer, wherein the p-type ohmic electrode is comprised of a ruthenium (Ru) layer, an iridium (Ir) layer, an osmium (Os) layer or an oxide layer thereof.

Alternatively, the GaN based optical device may include a substrate, a p-GaN layer formed on the substrate, and a p-type ohmic electrode formed on the p-GaN layer, wherein the p-type ohmic electrode is formed of a double layer comprised of a ruthenium (Ru) layer as a base layer, and a nickel (Ni) layer, an indium tin oxide (ITO) layer or an gold oxide (AuO) layer formed on the Ru layer.

In another aspect of the present invention, there is provided a method of fabricating a GaN based optical device including forming a p-GaN layer on a substrate and forming a metal layer pattern on the p-GaN layer, the metal layer pattern comprised of an Ru layer, an Ir layer or an Os layer. Then, the metal layer pattern is annealed and a p-type ohmic electrode is formed. The annealing of the metal layer pattern may be performed under an oxygen or nitrogen atmosphere.

Alternatively, the method of fabricating a GaN based optical device according to the present invention may include forming a p-GaN layer on a substrate and then forming a metal layer pattern on the p-GaN layer, the metal layer pattern formed of a double layer comprised of a ruthenium (Ru) layer as a base layer, and a nickel (Ni) layer, an indium tin oxide (ITO) layer or an gold oxide (AuO) layer. Then, the metal layer pattern is annealed and a p-type ohmic electrode is formed. The annealing of the metal layer pattern may be performed under an oxygen or nitrogen atmosphere.

The GaN based optical device with the p-type ohmic electrode according to the present invention is good in light transmittance and is thermally stable while having low contact resistance with the p-GaN layer.

BRIEF DESCRIPTION OF THE DRAWINGS

The above aspect and advantages of the present invention will become more apparent by describing in detail preferred embodiments thereof with reference to the attached drawings in which.

DETAILED DESCRIPTION OF THE INVENTION

Figure 1A:
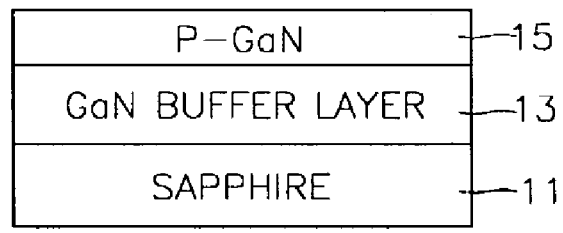
FIGS. 1A through 1E are cross-sectional views of a p-type ohmic electrode in a gallium nitride based (GaN based) optical device according to the present invention and a fabrication method thereof.

Now referring to the drawings, an explanation will be given of embodiments of the present invention. However, the following illustrative embodiments may be modified in various forms and the invention is not limited by the embodiments. These embodiments are provided for explaining the invention more perfectly to one skilled in the art. In the drawings, some dimensions of layers or regions may be exaggerated for the sake of clarity of the description. Also, when it is said that a layer exists "on" another layer or a substrate, the layer may directly exist on another layer or the substrate or a third layer may interposed therebetween.

FIGS. 1A through 1E are cross-sectional views of a p-type ohmic electrode in a gallium nitride based (GaN based) optical device according to the present invention and a fabrication method thereof, in which the p-type ohmic electrode is formed so as to measure ohmic contact resistance rather than being directly formed on the GaN based optical device.

In detail, as shown in FIG. 1A, a GaN buffer layer 13 is on a sapphire substrate 11. Then, a p-GaN layer 15 is formed on the GaN buffer layer 13.

Figure 1B:
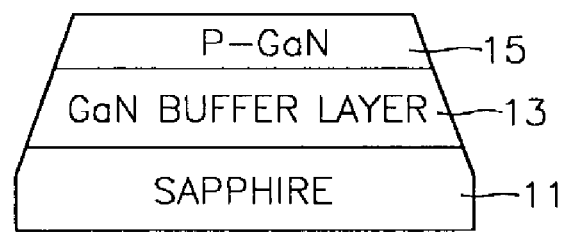

As shown in FIG. 1B, the p-GaN (p-GaN) layer 15 and the GaN buffer layer 13 are subjected to mesa etch. The mesa etch is performed using inductively coupled plasma apparatus.

Then, the mesa-etched p-GaN 15 is surface-treated. The mesa-etched p-GaN layer 15 is then surface-treated. The surface-treating of the p-GaN layer 15 is performed by dipping the substrate having the p-GaN layer 15 into a boiling solution containing HCl and deionized water ($H_2O$) mixed in 3:1, washing the resultant product with deionized water, and drying with nitrogen. Then, the substrate having the p-GaN layer 15 is dipped into a solution containing HCl and deionized water mixed in the same amount for 1 minute for pre-treatment.

Figure 1C:
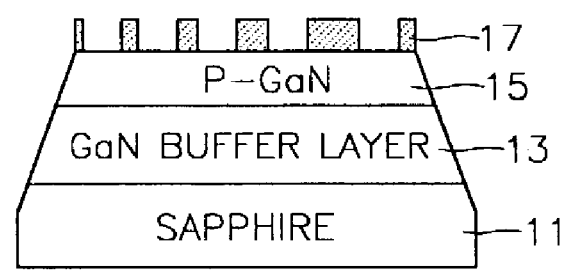

As shown in FIG. 1C, a photoresist pattern 17 is formed on the p-GaN layer 15. The photoresist pattern 17 is formed by general photolithography.

Figure 1D:
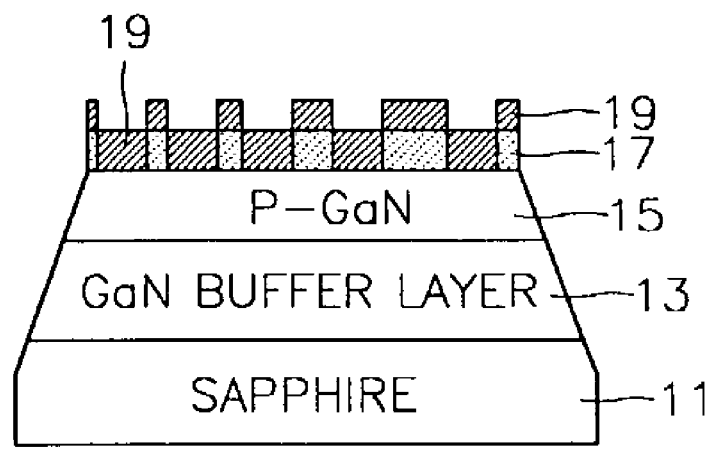

As shown in FIG. 1D, a metal layer 19 is formed over the entire surface of the substrate 11 having the photoresist pattern 17 and the p-GaN layer 15. The metal layer 19 may be a rutile transition metal layer made of Ru, Ir or Os, or a double layer formed on the Ru layer, comprised of an Ru layer as a base layer and an Ni layer, an ITO (indium Tin oxide) layer or an AgO layer. The metal layer 19 is formed using an e-beam evaporator.

In this embodiment, the metal layer 19 is an Ru layer having a thickness of 100 ., or a double layer formed by sequentially stacking an Ru layer and an Ni layer (to be referred to as an Ru/Ni layer). In the latter case, the Ru layer and Ni are stacked to a thickness of 50 ., respectively.

Figure 1E:
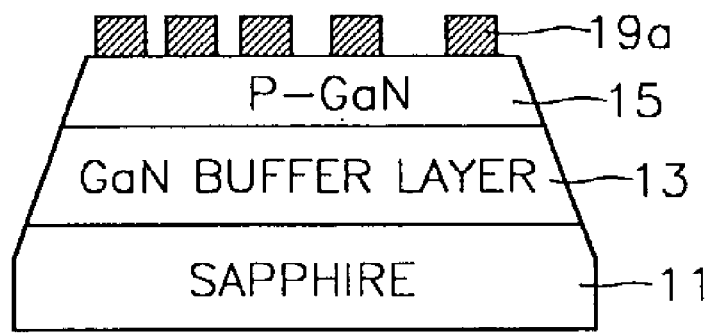

As shown in FIG. 1E, the photoresist pattern 17 and the metal layer 19 on the photoresist pattern 17 are removed by a lift-off process, thereby forming a metal layer pattern 19a. Subsequently, the metal layer pattern 19a was annealed at approximately 500. using rapid thermal annealing equipment under oxygen or nitrogen atmosphere, thereby completing a p-type ohmic electrode. When the metal layer for the ohmic electrode is formed of a rutile structure transition metal layer, e.g., a Ru, Ir or Os layer, the p-type ohmic electrode may be annealed to become an $RuO_2$ layer, an $IrO_2$ layer or an $OsO_2$ layer. Since the $RuO_2$ layer, the $IrO_2$ layer and the $OsO_2$ layer are good in thermal stability and very low in specific resistance, that is, $5 \times 10^{-5}$·cm, and have a work function of 5 eV or more, they are suitably used as a p-type ohmic electrode on the p-GaN layer 15. Also, an oxide layer such as the $RuO_2$, $IrO_2$ and $OsO_2$ layer is more transparent than a metal layer having the same thickness, thereby increasing transmittance. Electrical properties of the thus formed p-type ohmic electrode are evaluated to calculate contact resistance.

Figure 2:
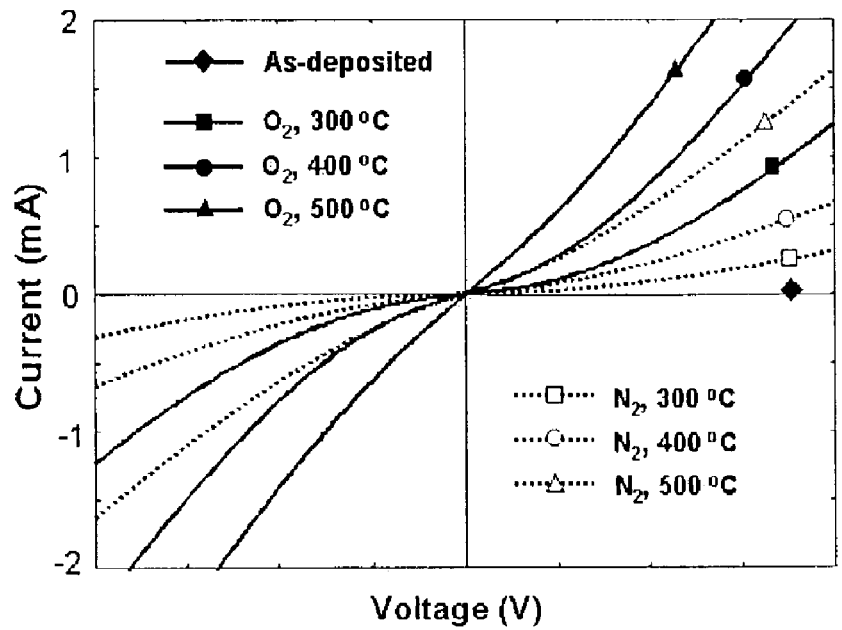
FIG. 2 is a graphical representation illustrating the current-voltage relationship depending on annealing atmosphere and temperature in the case where the p-type ohmic electrode shown in FIG. 1 is formed of an Ru layer.

FIG. 2 is a graphical representation illustrating the current-voltage relationship depending on annealing atmosphere and temperature in the case where the p-type ohmic electrode shown in FIG. 1 is formed of an Ru layer.

In detail, when the p-type ohmic electrode shown in FIG. 1 is formed of an Ru layer to a thickness of 100 ., and FIG. 2 shows the current-voltage relationship depending on annealing temperatures of the p-type ohmic electrode when annealed at 300.500. under oxygen or nitrogen atmosphere. Curves with marks ., . and . indicate that annealing is performed under a nitrogen ($N_2$) atmosphere, curves with marks ., . and . indicate that annealing is performed under an oxygen ($O_2$) atmosphere, and a line with a mark . indicates the p-type ohmic electrode as deposited. As shown in FIG. 2, ohmic characteristics of the p-type ohmic electrode are enhanced with annealing temperatures increasing under both the nitrogen and oxygen atmospheres. In particular, annealing in $O_2$ increases ohmic characteristics of the p-type ohmic electrode more greatly.

Figure 3:
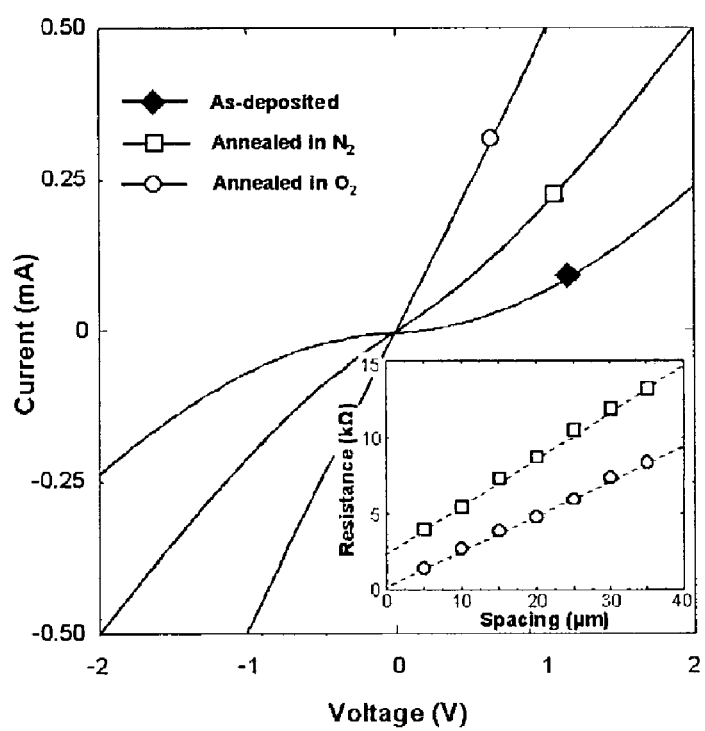
FIG. 3 is a graphical representation illustrating the current-voltage relationship depending on annealing atmosphere in the case where the p-type ohmic electrode shown in FIG. 1 is formed of an Ru/Ni layer.

FIG. 3 is a graphical representation illustrating the current-voltage relationship depending on annealing atmosphere in the case where the p-type ohmic electrode shown in FIG. 1 is formed of a double layer comprised of an Ru layer and a Ni layer, each having a thickness of 50 ., and the current-voltage relationship depending on annealing temperatures of the p-type ohmic electrode when annealed at 500. under oxygen or nitrogen atmosphere for 1 minute. As shown in FIG. 3, the p-type ohmic electrode annealed in $O_2$ exhibits a better current-voltage characteristic than the p-type ohmic electrode annealed in $N_2$.

The contact resistance of the p-type ohmic electrode annealed in $O_2$ is $4.5 \times 10^{-5}$·cm$^2$, which is approximately 1/100 lower than that of the p-type ohmic electrode annealed in $N_2$, that is, $4.4 \times 10^{-3}$·cm$^2$. Such contact resistance levels are considerably low for contact resistance of a p-type ohmic electrode of a GaN based optical device. A graphical representation defined by a smaller square boundary is for resistance over a spacing (distance) between p-type ohmic electrode patterns when contact resistance is measured by a transmission line method (TLM). The slope of resistance of the p-type ohmic electrode annealed in $O_2$ is smaller than that of the p-type ohmic electrode annealed in $N_2$, suggesting that the p-type ohmic electrode is more reliable in contact resistance measured after annealing in $O_2$ compared to the p-type ohmic electrode annealed in $N_2$.

Figure 4A:
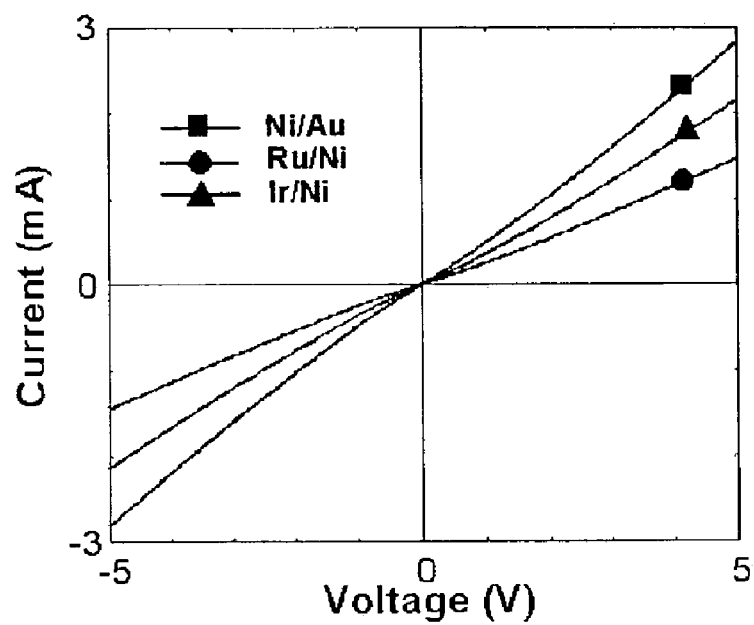
FIGS. 4A and 4B are graphical representations illustrating the current-voltage relationship depending on annealing temperature in a conventional p-type ohmic electrode formed of an Ni/Au layer and a p-type ohmic electrode according to the present invention.
Figure 4B:
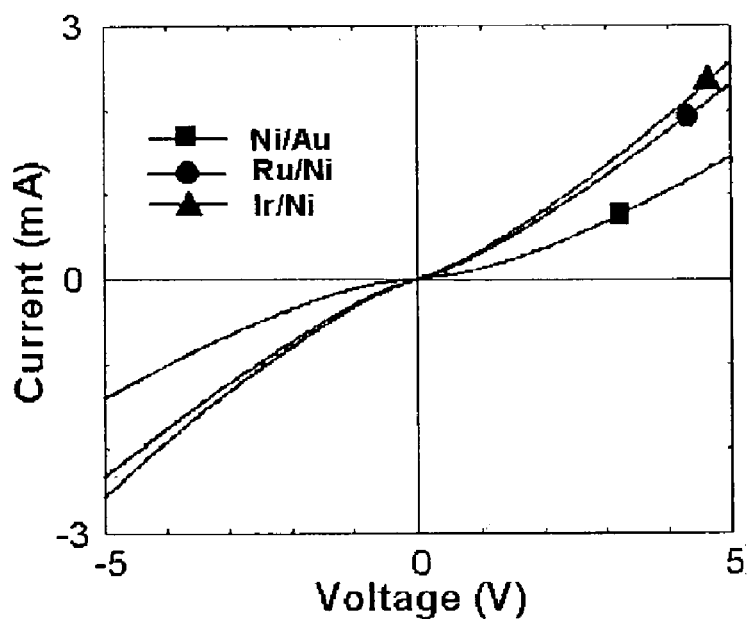

FIGS. 4A and 4B are graphical representations illustrating the current-voltage relationship depending on annealing temperature in a conventional p-type ohmic electrode formed of an Ni/Au layer and a p-type ohmic electrode according to the present invention.

In detail, whereas the conventional p-type ohmic electrode is formed as an Ni layer and an Au layer, each having a thickness of 50 ., respectively, the p-type ohmic electrode according to the present invention is formed as an Ru (or Ir) layer and an Ni layer, each having a thickness of 50 ., respectively. FIG. 4A shows the current-voltage relationship in the conventional p-type ohmic electrode and the p-type ohmic electrode when annealed at 500. for 1 minute, and FIG. 4B shows the current-voltage relationship in the conventional p-type ohmic electrode and the p-type ohmic electrode when further annealed for 24 hours after 1 minute annealing.

As shown in FIGS. 4A and 4B, while the conventional p-type ohmic electrode comprised of Ni/Au shows a considerable reduction in current and voltage characteristics as the annealing time increases, the p-type ohmic electrode according to the present invention shows a small reduction in current and voltage characteristics over annealing time, which means that the p-type ohmic electrode according to the present invention is good in thermal stability.

Figure 5:
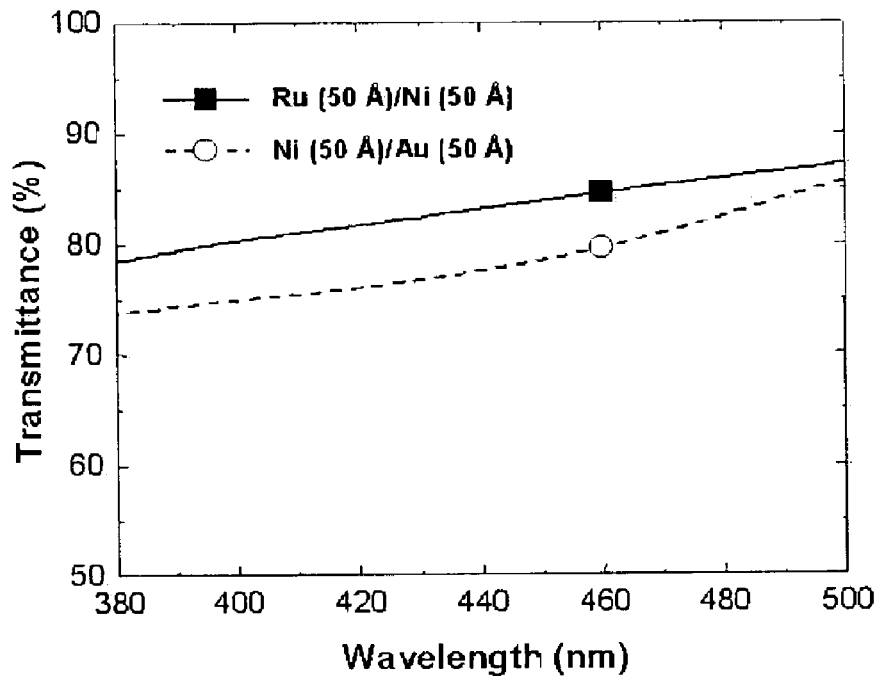
FIG. 5 is a graphical representation illustrating the light transmittance depending on wavelength in a conventional p-type ohmic electrode formed of an Ni/Au layer and a p-type ohmic electrode according to the present invention.

FIG. 5 is a graphical representation illustrating the light transmittance depending on wavelength in a conventional p-type ohmic electrode formed of an Ni/Au layer and a p-type ohmic electrode according to the present invention, in which the conventional p-type ohmic electrode is formed as an Ni layer and an Au layer, each having a thickness of 50., and annealing is performed under an oxygen atmosphere, and the p-type ohmic electrode is formed as an Ru layer and an Ni layer, each having a thickness of 50., and annealing is performed under an oxygen atmosphere.

As shown in FIG. 5, in a wavelength region of 300.500 nm, the p-type ohmic electrode according to the present invention exhibits transmittance approximately 5% higher than the conventional p-type ohmic electrode. In particular, in 460 nm, the p-type ohmic electrode according to the present invention has high transmittance, that is, approximately 85%. The reason why the p-type ohmic electrode according to the present invention having high transmittance is presumably that a metal layer forming the p-type ohmic electrode is converted into a transparent oxide layer after annealing. On the other hand, the conventional p-type ohmic electrode comprised of Ni/Au acts as a barrier in transmitting light because the Au layer is not converted into an oxide layer even after annealing.

Figure 6:
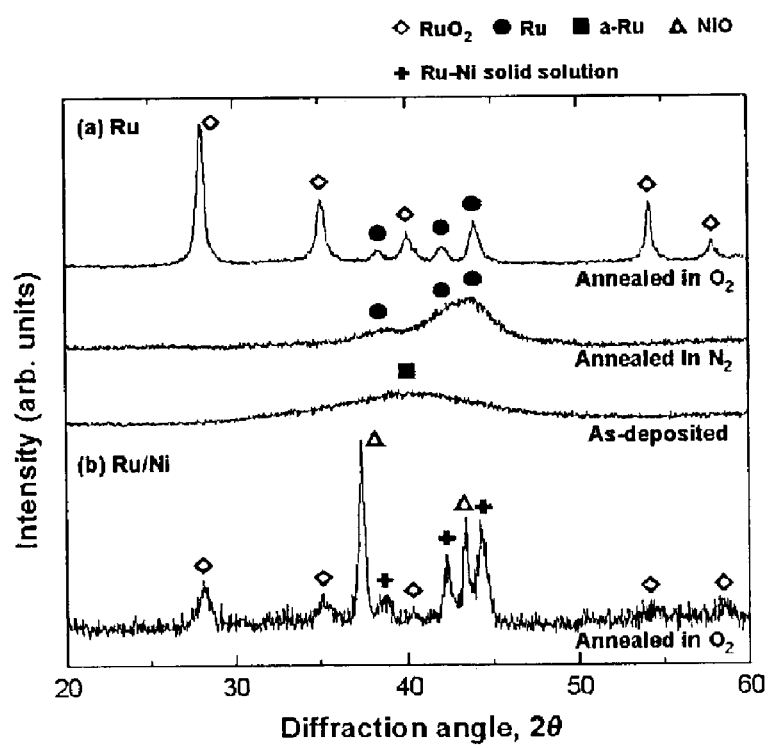
FIG. 6 is a graphical representation illustrating changes in x-ray diffraction peaks depending on annealing in a p-type ohmic electrode according to the present invention.

FIG. 6 is a graphical representation illustrating changes in x-ray diffraction peaks depending on annealing in a p-type ohmic electrode according to the present invention.

In detail, FIG. 6 shows the result of X-ray diffraction analysis performed for the purpose of verifying a phase change of the transparent p-type ohmic electrode according to annealing. Referring to FIG. 6, the p-type ohmic electrode comprised of an Ru layer as deposited shows a wide diffraction peak (., a-Ru) at a diffraction angle around 40°, suggesting that prior to annealing, the Ru layer as deposited is in an amorphous phase. In the p-type ohmic electrode with the Ru layer annealed in $N_2$ at 500° C., only diffraction peaks(.) corresponding to Ru are observed. On the other hand, in the p-type ohmic electrode annealed in $O_2$, diffraction peaks ($\diamond$) corresponding to $RuO_2$ are mainly observed. Thus, it is understood that annealing in $O_2$ converts the Ru layer into an $RuO_2$ layer. When the p-type ohmic electrode comprised of Ru/Ni is annealed in $O_2$, diffraction peaks ($\diamond$, .)corresponding to $RuO_2$ and NiO are largely observed. In FIG. 6, mark (+) indicates Ru—Ni solid solution.

Figure 7A:
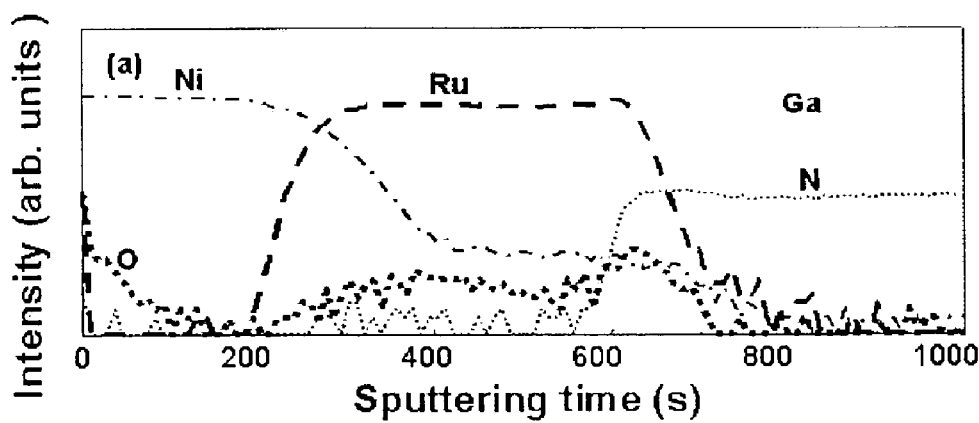
FIGS. 7A through 7C are graphical representations of secondary ion mass spectroscopy (SIMS) depending on annealing atmosphere in the case where the p-type ohmic electrode shown in FIG. 1 is formed of an Ru/Ni layer.
Figure 7B:
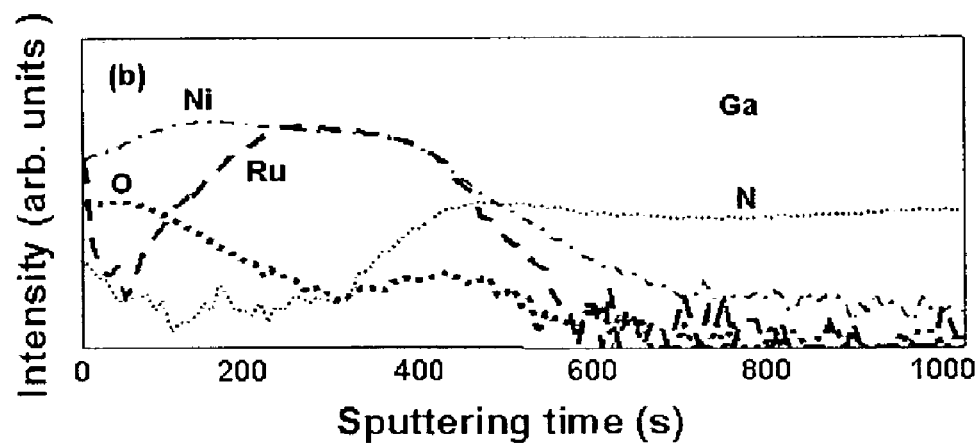
Figure 7C:
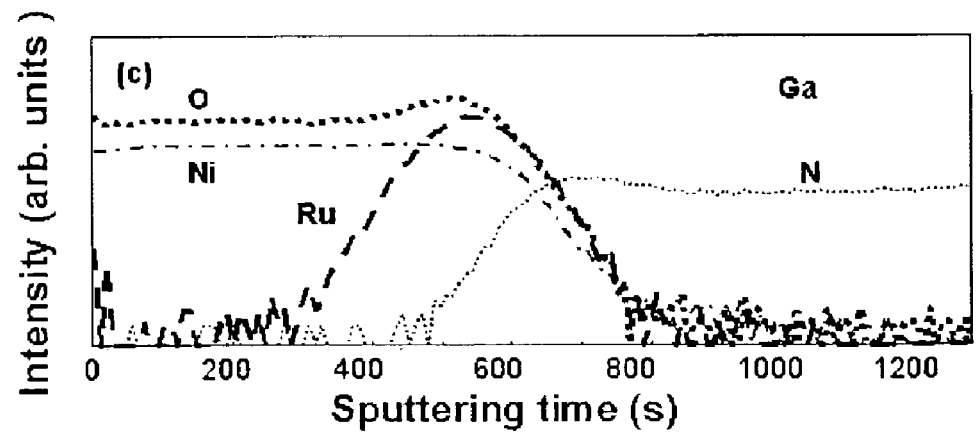

FIGS. 7A through 7C are graphical representations of secondary ion mass spectroscopy (SIMS) depending on annealing atmosphere in the case where the p-type ohmic electrode shown in FIG. 1 is formed of an Ru/Ni layer. In FIGS. 7A through 7C, X-axis denotes the sputtering time of Cs ion applied to the GaN based optical device shown in FIG. 1, and Y-axis denotes the ion intensity emitted from the GaN based optical device shown in FIG. 1.

In detail, FIG. 7A shows the result in the case where the GaN based optical device shown in FIG. 1 is not annealed, FIG. 7B shows the result in the case where the GaN based optical device shown in FIG. 1 is annealed in $N_2$ at 500° C., and FIG. 7C shows the result in the case where the GaN based optical device shown in FIG. 1 is annealed in $O_2$.

As shown in FIG. 7B, during annealing in $N_2$, inter-diffusion (mutual diffusion) between the Ru layer and the Ni layer occurs. Here, the inter-diffusion mainly refers to internal diffusion of Ni, rather than external diffusion of Ru, and some NiO is formed around the surface of the ohmic electrode. Also, gallium and nitrogen atoms decomposed during annealing are externally diffused into the p-type ohmic electrode. Such external diffusion results in deterioration of contact resistance of the p-GaN layer.

As shown in FIG. 7C, the atomic distribution of the p-type ohmic electrode annealed in $O_2$ is different from that annealed in $N_2$. Distribution of oxygen from the surface to a portion inside an interface between metal/semiconductor is very similar to that of Ni and Ru, confirming that the two metal layers are converted into $RuO_2$ and NiO layers, respectively. Since the work function of metallic Ru is larger than that of $RuO_2$, formation of a contact structure between $RuO_2$ and the p-GaN lowers a hole injection barrier, thereby reducing contact resistance. Here, it is notable that during annealing in $O_2$, external diffusion of gallium (Ga) and nitrogen (N) atoms does not occur. That is to say, the NiO layer formed on the surface of the p-type ohmic electrode effectively prevents external diffusion of Ga and N atoms, thereby further reducing contact resistance during annealing.

As described above, the p-type ohmic electrode in a GaN based optical device according to the present invention is fabricated using a rutile structure transition metal layer, such as an Ru, Ir or Os layer, or an oxide layer thereof. Alternatively, the p-type ohmic electrode in a GaN based optical device according to the present invention may be fabricated using a double layer comprised of an Ru layer as a base layer and an Ni layer, an ITO layer or an AuO layer on the Ru layer. The thus-formed p-type ohmic electrode is good in light transmittance and is thermally stable while having low contact resistance with the p-GaN layer.

What is claimed is:

1. A method of fabricating a GaN based optical device comprising:

forming a p-GaN layer on a substrate;

forming a metal layer pattern consisting of an Ru layer, an Ir layer or an Os layer as a contacting layer contacting the p-GaN layer; and annealing the metal layer pattern contacting the p-Gan layer under an oxygen atmosphere to form a p-type ohmic electrode consisting of a ruthenium (RU) oxide, an iridium (Ir) oxide or an osium (Os) oxide.

2. A method of fabricating a GaN based optical device comprising:

forming a p-GaN layer on a substrate;

forming a metal layer pattern on the p-GaN layer, the metal layer pattern formed of a double layer comprised of a ruthenium (Ru) layer as a base layer, and a nickel (Ni) layer, an indium tin oxide (ITO) layer or an gold oxide (AuO) layer formed on the Ru layer; and annealing the metal layer pattern under an oxygen atmosphere to form a p-type ohmic electrode formed of a double layer comprised of a ruthenium (Ru) oxide as a base layer, and one of a nickel (Ni) oxide layer, an indium tin oxide (ITO) layer and an gold oxide (AuO) layer formed on the Ru oxide.

* * * * *